United States Patent
Moon et al.

(10) Patent No.: US 8,471,268 B2
(45) Date of Patent: Jun. 25, 2013

(54) LIGHT EMITTING DEVICE

(75) Inventors: Won Ha Moon, Gyunggi-do (KR);
Chang Hwan Choi, Gyunggi-do (KR);
Dong Woohn Kim, Gyunggi-do (KR);
Hyun Jun Kim, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/224,676

(22) Filed: Sep. 2, 2011

(65) Prior Publication Data

US 2011/0315957 A1    Dec. 29, 2011

Related U.S. Application Data

(62) Division of application No. 12/000,360, filed on Dec. 12, 2007, now Pat. No. 8,030,664.

(30) Foreign Application Priority Data

Dec. 15, 2006 (KR) .................... 10-2006-0129003
Dec. 15, 2006 (KR) .................... 10-2006-0129004

(51) Int. Cl.
*H01L 33/06*   (2010.01)

(52) U.S. Cl.
USPC ........ 257/79; 257/13; 257/14; 257/E33.008; 257/E29.076; 977/762

(58) Field of Classification Search
USPC ........ 257/13, 30, 102, E29.071, 79; 977/774; 313/498, 503
See application file for complete search history.

(56) References Cited

U.S. PATENT DOCUMENTS

| | | | |
|---|---|---|---|
| 5,710,436 A * | 1/1998 | Tanamoto et al. | 257/14 |
| 6,294,794 B1 * | 9/2001 | Yoshimura et al. | 257/14 |
| 6,525,337 B1 * | 2/2003 | Ugajin et al. | 257/14 |
| 6,690,027 B1 * | 2/2004 | Bensahel et al. | 257/14 |
| 6,770,902 B2 | 8/2004 | Phillips | |
| 6,770,903 B2 | 8/2004 | Lin et al. | |
| 6,773,946 B2 | 8/2004 | Moon et al. | |
| 6,791,105 B2 * | 9/2004 | Shim et al. | 257/14 |
| 6,797,412 B1 * | 9/2004 | Jain et al. | 428/690 |
| 6,905,977 B2 * | 6/2005 | Lin et al. | 438/753 |

(Continued)

FOREIGN PATENT DOCUMENTS

JP         05-190903         7/1993
KR    10-2005-0098538 A    10/2005

OTHER PUBLICATIONS

Korean Office Action, with English Translation, issued in Korean patent Application No. KR 10-2006-0129003 dated Apr. 21, 2008.

(Continued)

*Primary Examiner* — David Vu
*Assistant Examiner* — Earl Taylor
(74) *Attorney, Agent, or Firm* — McDermott Will & Emery LLP

(57) ABSTRACT

There is provided a light emitting device of a simpler structure, capable of ensuring a broad light emitting area and a high light emitting efficiency, while manufactured in a simplified and economically efficient process. The light emitting device including: a semiconductor layer; an active layer formed on the semiconductor layer, the active layer comprising at least one of a quantum well structure, a quantum dot and a quantum line; an insulating layer formed on the active layer; and a metal layer formed on the insulating layer.

9 Claims, 14 Drawing Sheets

U.S. PATENT DOCUMENTS

| | | | |
|---|---|---|---|
| 6,907,056 B2 | 6/2005 | Botez | |
| 6,967,345 B1 | 11/2005 | Gunapala et al. | |
| 7,015,497 B1 | 3/2006 | Berger | |
| 7,061,014 B2 | 6/2006 | Hosono et al. | |
| 7,094,617 B2* | 8/2006 | Shim et al. | 438/22 |
| 7,254,150 B2 | 8/2007 | Yoshida et al. | |
| 7,279,716 B2* | 10/2007 | Chen | 257/94 |
| 7,306,963 B2 | 12/2007 | Linden | |
| 7,326,908 B2* | 2/2008 | Sargent et al. | 250/214.1 |
| 7,358,101 B2* | 4/2008 | Yang et al. | 438/21 |
| 7,414,294 B2* | 8/2008 | Forrest | 257/431 |
| 7,595,511 B2 | 9/2009 | Kang | |
| 7,701,629 B2* | 4/2010 | Wang et al. | 359/248 |
| 7,737,046 B2* | 6/2010 | Takeda et al. | 438/761 |
| 7,750,425 B2* | 7/2010 | Forrest et al. | 257/441 |
| 7,777,233 B2* | 8/2010 | Kahen et al. | 257/79 |
| 7,800,302 B2* | 9/2010 | Choi et al. | 313/509 |
| 7,820,064 B2 | 10/2010 | Jin | |
| 7,880,377 B2* | 2/2011 | Orita et al. | 313/503 |
| 7,910,400 B2* | 3/2011 | Kwon et al. | 438/99 |
| 8,017,860 B2* | 9/2011 | Lee | 136/252 |
| 8,030,664 B2* | 10/2011 | Moon et al. | 257/79 |
| 2002/0008232 A1 | 1/2002 | Gunapala et al. | |
| 2003/0010971 A1* | 1/2003 | Zhang et al. | 257/15 |
| 2003/0201434 A1 | 10/2003 | Lin et al. | |
| 2004/0041144 A1* | 3/2004 | Shim et al. | 257/13 |
| 2004/0094756 A1 | 5/2004 | Moon et al. | |
| 2004/0129932 A1 | 7/2004 | Jang et al. | |
| 2004/0188694 A1 | 9/2004 | Lin et al. | |
| 2004/0252737 A1 | 12/2004 | Yi et al. | |
| 2005/0001538 A1* | 1/2005 | Ozkan et al. | 313/503 |
| 2005/0006636 A1* | 1/2005 | Shim et al. | 257/14 |
| 2005/0006656 A1* | 1/2005 | Jain et al. | 257/88 |
| 2005/0031000 A1 | 2/2005 | Botez | |
| 2005/0117617 A1 | 6/2005 | Yoshida et al. | |
| 2005/0161662 A1 | 7/2005 | Majumdar et al. | |
| 2006/0033113 A1 | 2/2006 | Lee et al. | |
| 2006/0097389 A1 | 5/2006 | Islam et al. | |
| 2006/0098705 A1 | 5/2006 | Wang et al. | |
| 2006/0115917 A1 | 6/2006 | Linden | |
| 2006/0170331 A1* | 8/2006 | Bertram et al. | 313/498 |
| 2006/0208273 A1 | 9/2006 | Kang | |
| 2006/0223211 A1 | 10/2006 | Mishra et al. | |
| 2006/0234407 A1 | 10/2006 | Kim et al. | |
| 2007/0057144 A1 | 3/2007 | Asano | |
| 2007/0137693 A1* | 6/2007 | Forrest | 136/255 |
| 2007/0151592 A1* | 7/2007 | Forrest et al. | 136/243 |
| 2007/0162263 A1* | 7/2007 | Forrest | 703/1 |
| 2007/0194694 A1* | 8/2007 | Reddy | 313/503 |
| 2007/0215856 A1* | 9/2007 | Kwon et al. | 257/14 |
| 2007/0235738 A1 | 10/2007 | Jin et al. | |
| 2007/0241662 A1* | 10/2007 | Choi et al. | 313/502 |
| 2007/0248135 A1 | 10/2007 | Mawst et al. | |
| 2008/0092953 A1* | 4/2008 | Lee | 136/261 |
| 2008/0142782 A1* | 6/2008 | Moon et al. | 257/13 |
| 2008/0157057 A1 | 7/2008 | Kim | |
| 2008/0180020 A1* | 7/2008 | Cok | 313/503 |
| 2008/0191191 A1 | 8/2008 | Kim | |
| 2008/0218068 A1* | 9/2008 | Cok | 313/505 |
| 2008/0309234 A1* | 12/2008 | Cho et al. | 313/509 |
| 2009/0039764 A1* | 2/2009 | Cho et al. | 313/504 |
| 2009/0079034 A1* | 3/2009 | Wang | 257/615 |
| 2009/0109435 A1* | 4/2009 | Kahen et al. | 356/317 |
| 2010/0025673 A1 | 2/2010 | Hu et al. | |
| 2010/0108986 A1* | 5/2010 | Fuertes Maron et al. | 257/14 |
| 2011/0297218 A1* | 12/2011 | Lee | 136/255 |

OTHER PUBLICATIONS

Korean Office Action, with English Translation, issued in Korean Patent Application No. KR 10-2006-0129004, mailed May 22, 2008.

Liao et al., 2 um emission from Si/Ge heterojunction LED and up to 1.55 um detection by GOI detectors with strain-enhanced features, IEEE, 2005, 4 pages.

Liu et al., Temperature dependence of the electron-hole-plasma electroluminescence from metal-oxide-silicon tunneling diodes, Applied Physics Letters, vol. 77, No. 8, 2000, pp. 1111-1113.

Kulakci et al., Electroluminescence generated by a metal oxide semiconductor light emitting diode (MOS-LED) with Si nanocrystals embedded in $SiO_2$ layers by ion implantation, Semicond. Sci. Technol., 21, 2006, pp. 1527-1532.

* cited by examiner

LIGHT EMITTING DEVICE

CROSS-REFERENCE TO RELATED APPLICATIONS

This application is a Divisional of U.S. application Ser. No. 12/000,360, filed on Dec. 12, 2007, now U.S. Pat. No. 8,030,664 which claims the priorities of Korean Patent Application No. 2006-129003 filed on Dec. 15, 2006 and Korean Patent Application No. 2006-129004 filed on Dec. 15, 2006, in the Korean Intellectual Property Office, the entire contents of each of which are hereby incorporated by reference.

BACKGROUND OF THE INVENTION

1. Field of the Invention

The present invention relates to a light emitting device, and more particularly, a light emitting device of a simpler structure capable of ensuring a broad light emitting area and a high light emitting efficiency, while manufactured in a simplified and economically efficient process.

2. Description of the Related Art

In a light emitting device, a material contained therein emits light. For example, a light emitting device may have a semiconductor junction using a diode to convert energy generated by recombination of holes and electrons into light.

A light emitting diode (LED) of a semiconductor junction structure currently manufactured is generally formed by junction of a p-type semiconductor and an n-type semiconductor. In the LED of the semiconductor junction structure, an active layer is disposed between the two semiconductors to emit light tuned to a desired wavelength.

For example, in manufacturing a compound semiconductor LED using at least two elements such as GaAs, typically a heterogeneous substrate is employed to grow the semiconductor epitaxially. Here, crystals grown experience defects due to stress caused by mismatch of lattice constant and thermal expansion coefficient.

Especially, a sapphire substrate, when employed in a nitride semiconductor, results in considerable defects due to a great mismatch between a nitride and the substrate, thereby degrading light emitting characteristics of a light emitting device manufactured.

Also, in the LED of the semiconductor junction structure, the n-type semiconductor and the p-type semiconductor should be grown on one substrate, which is, however, a difficult process.

The LED has been recently fabricated as a nanorod or a nanowire to be utilized as the light emitting device. For example, an n-type nanorod and a p-type nanorod are formed to cross each other in order to emit light at an intersection. Here, the nanoscale device emits blue-shifted light owing to stress induced by decrease in a diameter thereof. Each of the nanorods, even when formed of a material with an identical composition, may have a light emitting wavelength varied by a diameter or a length thereof.

In addition to the LED, efforts have been under way to utilize as a light emitting device a Metal Insulator Semiconductor (MIS) formed of a metal-insulator-semiconductor in use for a conventional capacitor. The MIS device features a simpler structure due to a fewer number of layers required than the aforesaid LED light emitting device, thereby simplifying a manufacturing process and saving manufacturing costs.

FIG. 1A is a cross-sectional view illustrating a conventional light emitting device 10 using an MIS structure. Hereinafter, the light emitting device 10 is assumed to be an m-i-p type light emitting device in which a semiconductor layer 11 is a p-type semiconductor.

The light emitting device 10 includes a semiconductor layer 11, an insulating layer 11 and a metal layer 15, and an electrode 17 formed underneath the semiconductor layer 11. An area A of the semiconductor layer 11 experiences recombination of holes and electrons by tunneling effects of the electrons, thereby generating light.

FIG. 1B illustrates an energy diagram illustrating such a light emitting mechanism. Referring to FIG. 1B, energy levels are plotted in a case where a minus (−) voltage is applied to the metal layer 15 and a plus (+) voltage is applied to the semiconductor layer 11.

With the minus (−) voltage applied to the metal layer 15, electrons $e^-$ migrate through the insulating layer 13 by tunneling effects. Subsequently, the electrons $e^-$ reach the semiconductor layer 11 and then recombine with holes $h^+$ in a valence band of the semiconductor layer 11 to generate photons.

However, in this MIS light emitting device, light generated when the tunneled electrons $e^-$ reach the semiconductor layer 11 to recombine with the holes $h^+$, is lower in light emitting efficiency than other light emitting devices, thus required to be increased in light emitting efficiency.

SUMMARY OF THE INVENTION

An aspect of the present invention provides a light emitting device of a simpler structure capable of ensuring a broad light emitting area and a high light emitting efficiency, while manufactured in a simplified and an economically efficient process.

According to an aspect of the present invention, there is provided a light emitting device including: a semiconductor layer; an active layer formed on the semiconductor layer, the active layer comprising at least one of a quantum well structure, a quantum dot and a quantum line; an insulating layer formed on the active layer; and a metal layer formed on the insulating layer.

The semiconductor layer may be formed of one of a GaN-based semiconductor, a ZnO-based semiconductor, a GaAs-based semiconductor, a GaP-based semiconductor, and a GaAsP-based semiconductor.

The active layer may include at least one layer. The active layer may include a quantum well structure, wherein the quantum well structure may be one of a single quantum well structure and a multiple quantum well structure.

The active layer may include a plurality of quantum dots, wherein the quantum dots may include one of a group III-V compound semiconductor and a group II-VI compound semiconductor. The quantum dots may be formed of a GaN-based compound.

The active layer may include a plurality of quantum lines, wherein the quantum lines may be formed of one of a group III-V compound semiconductor and a group II-VI compound semiconductor.

The active layer may include the quantum lines and an organic compound surrounding the quantum lines.

An outermost layer in a propagation direction of light from the light emitting device may have microstructure formed on a surface thereof. The semiconductor layer, the insulating layer and the metal layer may have microstructures formed on surfaces thereof, respectively.

The metal layer may have a plurality of holes formed in a surface thereof. The holes may be extended to a portion between a top of the insulating layer and a top of the active layer.

The light emitting device may further include a photonic crystal structure formed on one surface thereof. The holes may have a diameter and a spacing of 200 nm to 1000 nm, respectively.

The light emitting device may further include a substrate, wherein a stack having the semiconductor layer, the active layer, the insulating layer and the metal layer sequentially stacked is formed on the substrate, wherein the stack is a nanowire structure. The substrate may be provided thereon with a nanowire array including a plurality of nanowire structures.

The active layer may include one of a quantum well structure and a quantum dot. The active layer may include at least one layer. The active layer may include a quantum well structure, wherein the quantum well structure may be one of a single quantum well structure and a multiple quantum well structure.

The active layer may include at least one quantum dot, wherein the quantum dot may be formed of a group III-V compound semiconductor. The quantum dot may be formed of a GaN-based compound. The active layer may include at least one quantum dot, wherein the quantum dot may be formed of a group II-VI compound semiconductor.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. This invention may, however, be embodied in many different forms and should not be construed as limited to the embodiments set forth therein. Rather these embodiments are provided so that this disclosure will be thorough and complete, and will fully convey the scope of the invention to those skilled in the art.

Figure 1A:
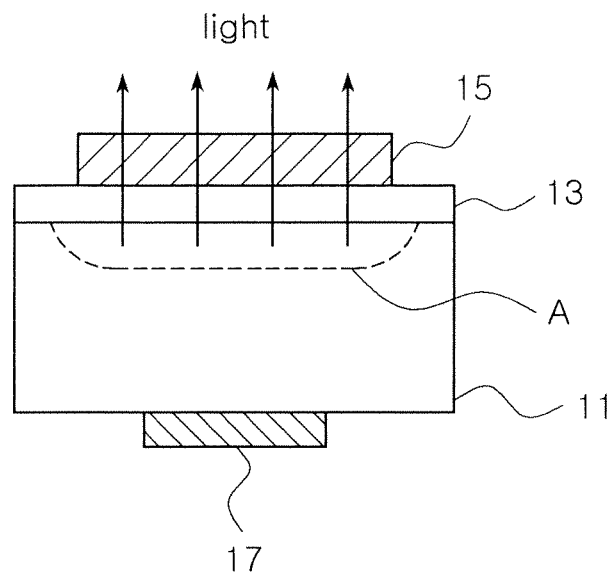
FIG. 1A is a cross-sectional view illustrating a conventional light emitting device with an MIS structure.
Figure 1B:
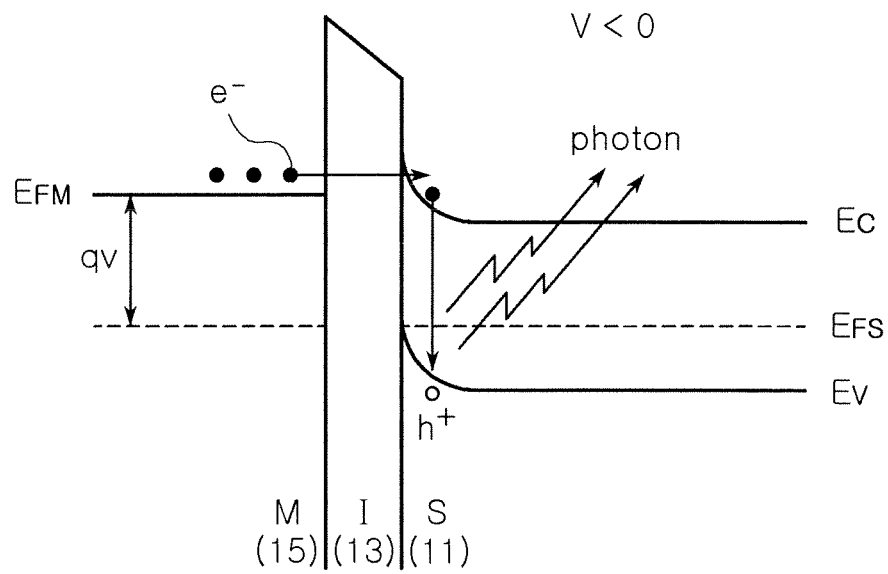
FIG. 1B is an energy diagram illustrating a light emitting device shown in FIG. 1A.
Figure 2:
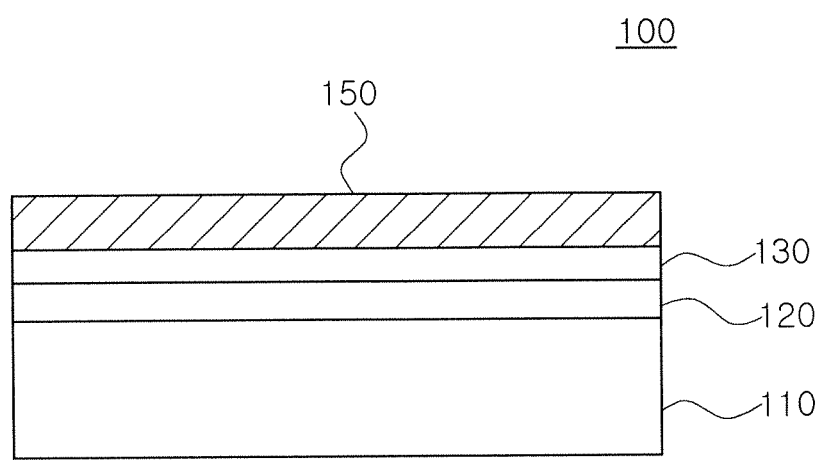
FIG. 2 is a cross-sectional view illustrating a light emitting device according to an exemplary embodiment of the invention.

FIG. 2 is a cross-sectional view illustrating a light emitting device 100 according to an exemplary embodiment of the invention.

The light emitting device 100 of the present embodiment includes a semiconductor layer 110, an active layer 120 formed on the semiconductor layer 110 to include at least one of a quantum well structure, a quantum dot and a quantum line, an insulating layer 130 formed on the active layer 120 and a metal layer 150 formed on the insulating layer 130.

The light emitting device 100 includes the active layer 120 between the semiconductor layer 110 and the insulating layer 130.

The semiconductor layer 110 may be formed of one of a GaN-based semiconductor, a ZnO-based semiconductor, a GaAs-based semiconductor, a GaP-based semiconductor and a GaAsP-based semiconductor.

The active layer 120 allows active emission of light from the light emitting device 100. To activate light emission, the active layer 120 may include at least one of the quantum well structure, the quantum dot and the quantum line. The active layer 120 may be formed of any structure defining the quantum well structure. For example, the active layer 120 may be formed of a GaN-based semiconductor. The activation function of the active layer 120 will be described with reference to FIG. 3.

The insulating layer 130 may be formed of a nitride or an oxide, and have a thickness of about 1 nm to 10 nm in view of tunneling of electrons e⁻ from the metal layer 150. Also, the insulating layer should have an energy band gap greater than a light emitting wavelength so as not to absorb photons generated in the semiconductor layer 110.

The metal layer 150 may be a transparent electrode transmitting light or a barrier metal reflecting light.

Figure 3:
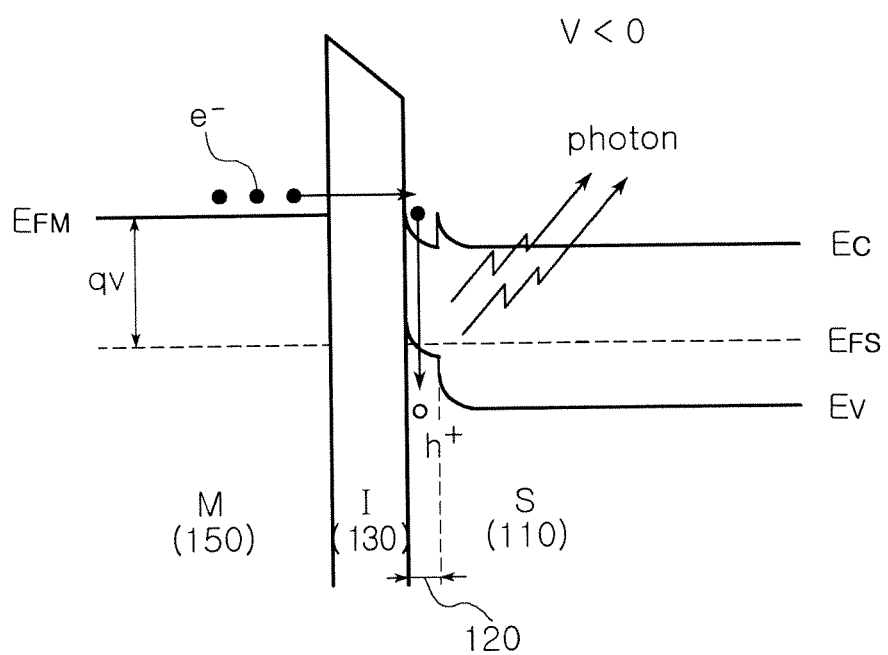
FIG. 3 is an energy diagram illustrating the light emitting device shown in FIG. 2.

FIG. 3 is an energy diagram of the light emitting device shown in FIG. 2. Hereinafter, the same components as described above will not be explained further.

When a minus (−) voltage is applied to the metal layer M, the electrons $e^-$ tunnel through the insulating layer I. The electrons $e^-$ migrating through the insulating layer 130 encounter the quantum well structure defined by the active layer 120. Accordingly, the electrons $e^-$ recombine with holes $h^+$ in the quantum well structure to generate photons.

The quantum well structure is formed of at least two materials having energy band gaps different from each other. In the quantum well structure, the active layer 120 having a band gap different from those of the insulating layer 130 and the semiconductor layer 110, respectively is disposed therebetween to assure higher quantum confinement effect. Consequently, the quantum well structure exhibits high photoluminescence.

That is, the quantum well structure defined by the active layer 120 allows the electrons $e^-$ to be recombined with the holes $h^+$ more easily, thereby enhancing light emitting efficiency.

Moreover, the quantum well structure may be one of a single well structure and a multiple well structure. Referring to FIG. 3, the quantum well structure represents a single well structure. A desired type of the quantum well structure can be controlled appropriately by adjusting the active layer. Hereinafter, the active layer 120 has a multiple well structure as the quantum well structure.

Figure 4:
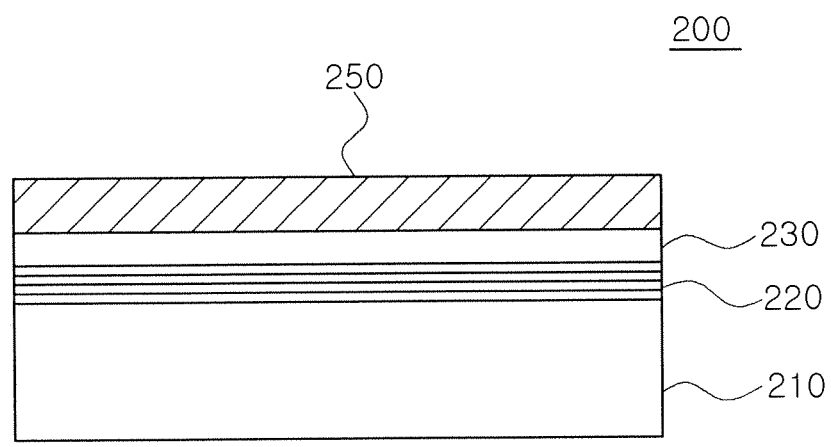
FIG. 4 is a cross-sectional view illustrating a light emitting device according to an exemplary embodiment of the invention.

FIG. 4 is a cross-sectional view illustrating a light emitting device 200 according to an exemplary embodiment of the invention.

Referring to FIG. 4, an active layer 220 disposed between a semiconductor layer 210 and an insulating layer 230 of the light emitting device 200 may include at least one layer. The active layer 220 is configured as a multilayer structure and thus may define a plurality of quantum well structures.

To form the active layer 220, a layer representing a quantum well structure and a layer representing an energy barrier may be stacked alternately. For example, the active layer 220 may include a GaN layer representing the quantum well structure and an AlGaN layer representing a barrier layer stacked alternately. The quantum well structure and the barrier layer may be stacked in an appropriate number of alternations by those skilled in the art in view of light emission efficiency.

Figure 5:
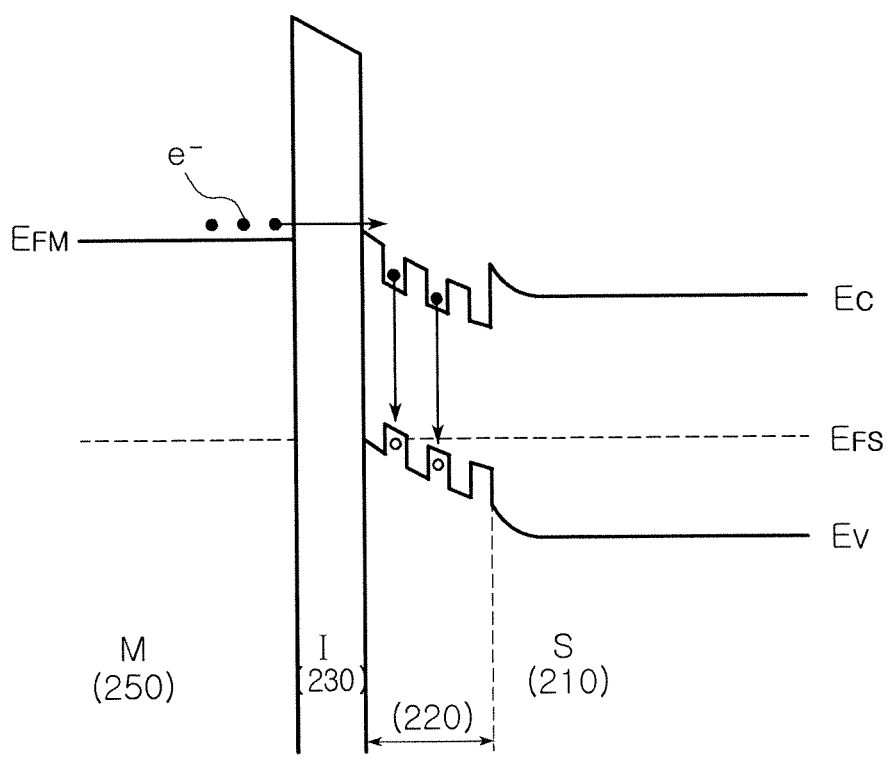
FIG. 5 is an energy diagram illustrating the light emitting device shown in FIG. 4.

FIG. 5 is an energy diagram of the light emitting device 200 shown in FIG. 4.

Referring to FIG. 5, the active layer 220 is formed of five layers, with the quantum well structure and the barrier layer stacked alternately 2.5 times. This allows a plurality of quantum well structures to be formed on a contact area between the insulating layer 230 and the semiconductor layer 210, thus further enhancing light emitting efficiency of the light emitting device 200.

Figure 6:
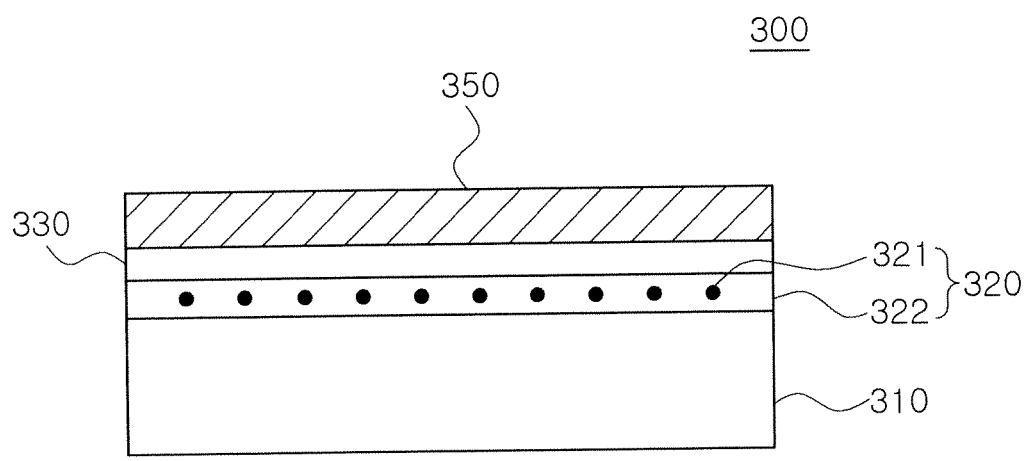
FIG. 6 is a cross-sectional view illustrating a light emitting device according to an exemplary embodiment of the invention.
Figure 7:
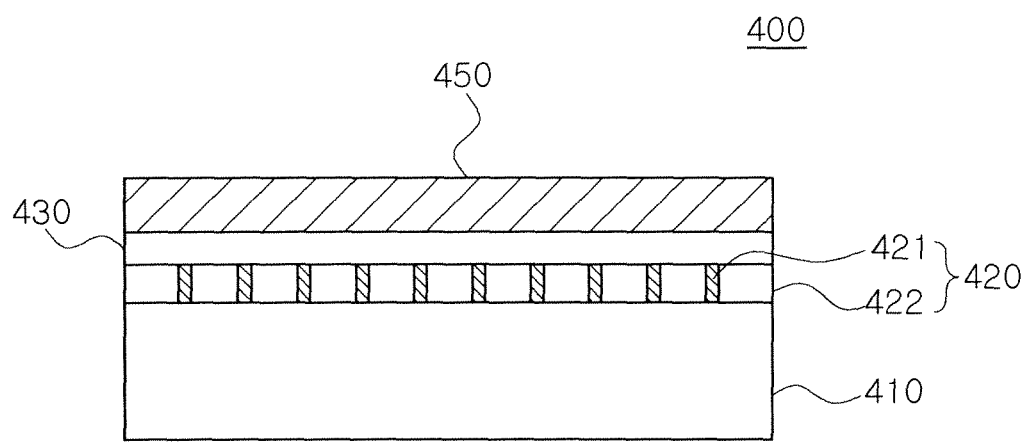
FIG. 7 is a cross-sectional view illustrating a light emitting device according to an exemplary embodiment of the invention.

FIG. 6 is a cross-sectional view illustrating a light emitting device 300 according to an exemplary embodiment of the invention, in which an active layer 320 includes quantum dots 321. FIG. 7 is a cross-sectional view illustrating a light emitting device 400 according to an exemplary embodiment of the invention, in which an active layer 420 includes quantum lines 421.

First, referring to FIG. 6, the active layer 320 includes the quantum dots 321. The quantum dots 321 may be formed of a GaN-based compound. A portion 322 of the active layer 320 excluding the quantum dots 321 may be formed of an insulator or a semiconductor.

The quantum dots 321 each have a diameter of several nm and are arranged three-dimensionally overall, thus ensuring high quantum confinement effect. This leads to effective confinement of electrons, consequently boosting light emission efficiency of the light emitting device 300.

Referring to FIG. 7, the active layer 420 includes the quantum lines 421. The quantum lines 421 are formed in the active layer 420, between a semiconductor layer 410 and an insulating layer 430. The quantum lines 421 may be formed of a semiconductor, e.g., one of a group III-V compound semiconductor and a group II-VI compound semiconductor. When the quantum lines 421 are formed of the group II-VI semiconductor, a portion of the active layer 422 excluding the quantum lines 421 may be formed of an organic semiconductor.

Figure 8:
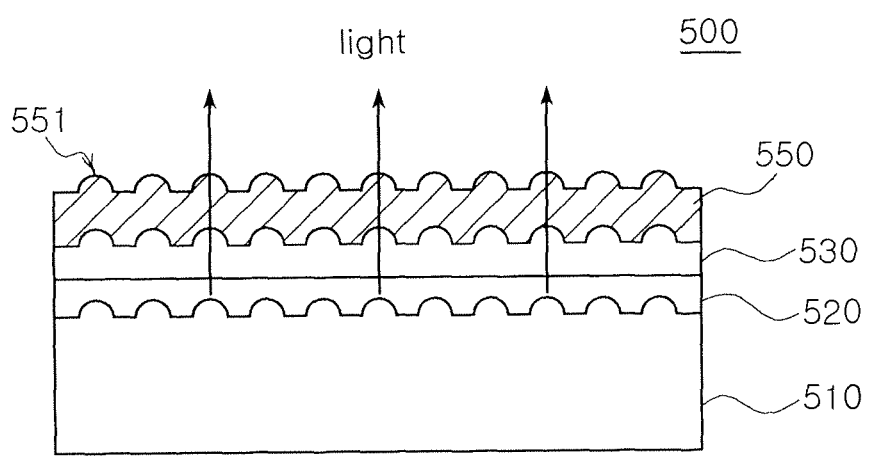
FIG. 8 is a cross-sectional view illustrating a light emitting device having microstructures formed thereon according to an exemplary embodiment of the invention.
Figure 9:
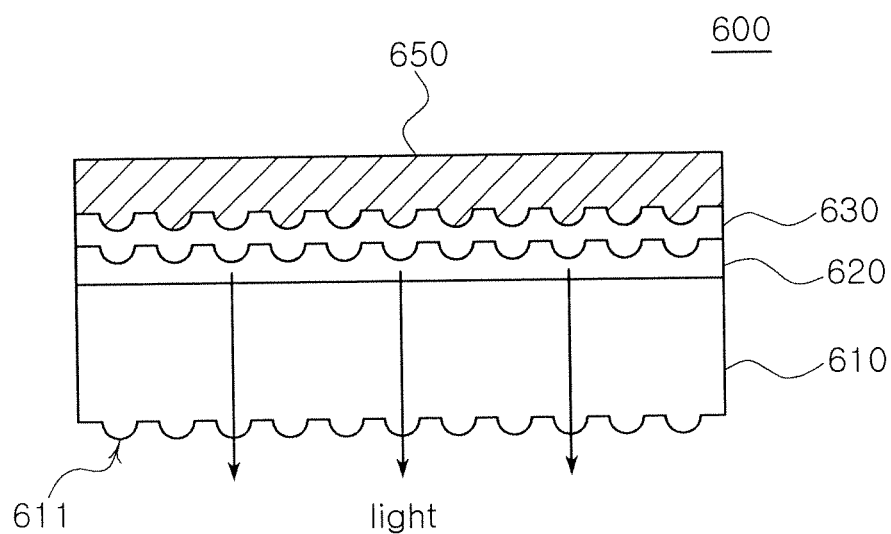
FIG. 9 is a cross-sectional view illustrating a light emitting device having microstructures formed thereon according to an exemplary embodiment of the invention.
Figure 10:
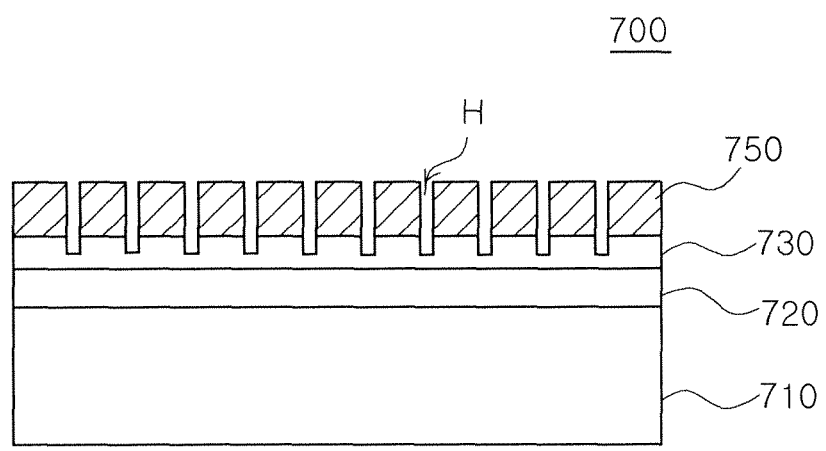
FIG. 10 is a cross-sectional view illustrating a light emitting device having holes formed therein to define a photonic crystal structure on one surface thereof according to an exemplary embodiment of the invention.

FIGS. 8 to 10 are cross-sectional views illustrating light emitting devices having microstructures formed thereon according to exemplary embodiments of the invention, respectively.

FIG. 8 illustrates a light emitting device 500 having microstructures 551 formed on one surface thereof. Especially, the microstructures are formed on a metal layer 550, an insulating layer 530 and a semiconductor layer 510, respectively.

The microstructures are not formed on the active layer 520. The microstructures, when formed on the active layer 520 may impair the active layer 520 too much and affect a light emitting surface directly.

With the microstructures formed, light emitted is free from adverse factors for light extraction efficiency such as total reflection on the surface and effectively scattered. This improves overall light extraction efficiency of the light emitting device 500.

Referring to FIG. 9, microstructures 611 are formed on a bottom of a light emitting device 600. This is because the microstructures formed on a surface in a propagation direction of light may enhance light extraction efficiency.

The microstructures may be formed on a metal layer 650, an insulating layer 630 and a semiconductor layer 610, respectively but particularly on a surface of an outermost layer in a propagation direction of light.

Therefore, in a case where the metal layer 550 is the outermost layer in a propagation direction of light, as shown in FIG. 8, the microstructures are formed on at least the metal layer 550. Also, in a case where the semiconductor layer 610 is the outermost layer in a propagation direction of light, as shown in FIG. 9, the microstructures are formed on at least the semiconductor layer 610.

FIG. 10 illustrates a light emitting device 700 in which microstructures are not formed on corresponding layers as in FIGS. 8 and 9 but more efficient structures than the microstructures are formed.

A plurality of holes H are formed uniformly with a predetermined depth in a surface of a metal layer 750. The holes each H are extended to reach a partial depth of the insulating layer 730, thereby exposing the insulating layer 730 from bottoms of the holes H. The light emitting device structured as above can represent a photonic crystal structure. Photonic crystals are composed of media with different refractive indexes arranged regularly like crystals. These photonic crystals allow extraction of light having a wavelength that is multiple times a wavelength of light, thereby further enhancing optical extraction efficiency.

The holes H may have a diameter and a spacing of about 200 nm to 1000 nm, respectively, in view of effective photonic crystal structure.

The holes H can be formed by an appropriate process after fabricating the light emitting device 700. For example, the holes H may be formed by etching.

In a case where the holes each H are extended to reach only the metal layer 750 or a partial depth of the metal layer 750 instead of the insulating layer 730, the light emitting device with these holes constitutes a surface plasmon structure, not a photonic crystal structure. Also, the holes H, if extended to the active layer 730, may damage the active layer 730.

The surface plasmon is a wave of electron density moving along an interface between a conductor and a non-conductor. This surface plasmon may be generated by incident light and resonance occurs at a certain incident angle satisfying resonance conditions. This is referred to as a surface plasmon resonance.

Under resonance conditions where momentums between incident photons and the surface plasmon are identical to each other, energy of light incident as the surface plasmon is greatly excited is absorbed as a radiation energy or a thermal energy. This consequently minimizes intensity of the light passing through a metal of the metal layer 750. Therefore, the holes H formed to reach only the metal layer 750 or a partial depth of the metal layer 750 may undesirably satisfy conditions for formation of this surface plasmon.

Referring to FIG. 10, the metal layer 750 is the outermost layer in a propagation direction of light. However, as shown in FIG. 9, in a case where the semiconductor layer 610 is the outermost layer in a propagation direction of light, it is evident that the holes may be formed in the semiconductor layer.

Figure 11:
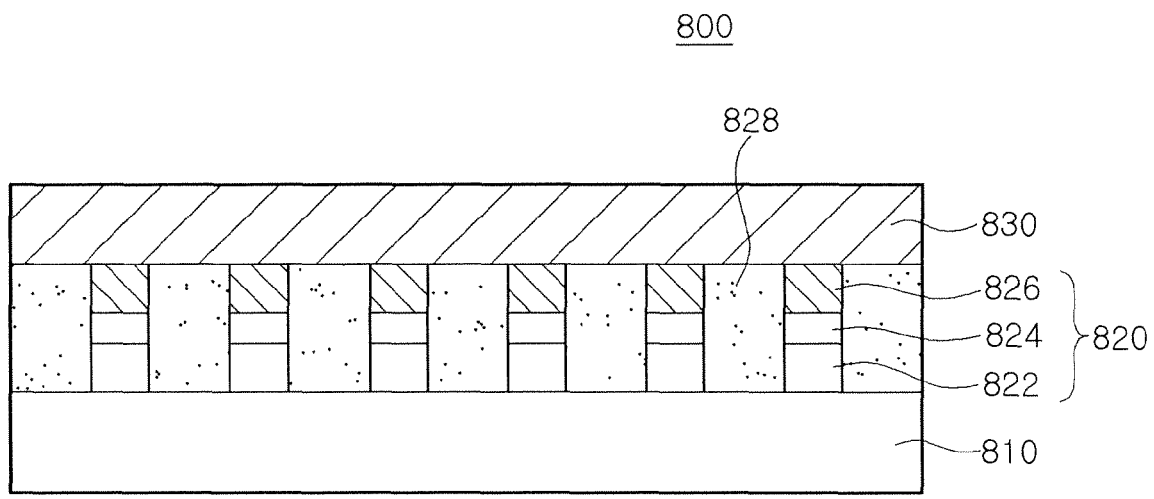
FIG. 11 is a cross-sectional view illustrating a light emitting device according an exemplary embodiment of the invention.

FIG. 11 is a cross-sectional view illustrating a light emitting device according to an exemplary embodiment of the invention.

The light emitting device 800 includes a substrate 810 and a nanowire array including nanowire structures 820 each having a metal layer 826, an insulating layer 824 and a semiconductor layer 822 sequentially stacked on the substrate 810. The nanowire array is formed on the substrate 810 and an electrode 828 is formed on a top of the nanowire array to apply a voltage for driving the light emitting device 800.

The nanowire structures 820 are formed top-down or bottom-up on the substrate 810. The substrate 810 may adopt any substrate matching in e.g., lattice constant with the nanowire structures 820. For example, the substrate 810 may employ a sapphire substrate or a SiC substrate, which has a GaN layer on a top thereof.

The nanowire structures 820 are formed on the substrate 810. Each of the nanowire structures 820 includes the semiconductor layer 822, the insulating layer 824 and the metal layer 826.

This nanowire structure 820 may feature a metal insulator semiconductor (MIS) structure.

The semiconductor layer 822 may be formed of a semiconductor for use in a general light emitting device of an MIS structure. Particularly, the semiconductor layer 822 may be formed of a direct-type compound semiconductor. The semiconductor layer 822 may be formed of one of a p-type semiconductor and an n-type semiconductor. For example, the semiconductor layer 822 may be formed of at least one of a GaN-based semiconductor, a ZnO-based semiconductor, a GaAs-based semiconductor having a composition expressed by $In_xAl_yGa_{1-x-y}N$, where $0 \leq x \leq 1$, $0 \leq y \leq 1$, and $0 \leq x+y \leq 1$, a GaP-based semiconductor, and a GaAsP-based semiconductor.

The insulating layer 824 may be formed of a nitride or an oxide, and have a thickness of about 1 nm to 10 nm in view of tunneling of electrons $e^-$ from the metal layer 826. Also, the insulating layer 824 should have an energy band gap greater than a light emitting wavelength so as not to absorb photons generated in the semiconductor layer 822.

The metal layer 826 may be formed of a transparent electrode transmitting light or a barrier metal reflecting light.

The semiconductor layers 822, the insulating layers 824 and the metal layers 826 each are stacked to constitute the respective nanowire structures as the MIS devices. The nanowire structures 820 are arranged on the substrate 810 regularly or irregularly to form the nanowire array.

A 'nanorod' denotes a rod-shaped material having a diameter of several nm to tens of nm. A 'nanowire' is shaped as an elongated line which is longitudinally greater than the nanorod.

The nanowire can be largely manufactured by top-down and bottom-down methods.

In the top-down method, a material for the nanowire is etched to form a nano structure. However, in this method, the material can be nano-scaled only to tens of nm, while manufacturing costs are increased with further size reduction of the material. This has led to development of many bottom-down methods.

Examples of the bottom-down method include an Anodic Aluminum Oxide template (AAO template) and a Vapor-liquid-Liquid-Solid phase (VLS phase).

In the AAO template method, aluminum is employed due to unique characteristics thereof. That is, aluminum forms an array of pores during an oxidization process for forming an oxidized aluminum.

Here, the pores have a diameter of tens of nm to hundreds of nm depending on density of an acid solution and a voltage during an oxidized process of the aluminum, and a length of μm. Therefore, when other materials are filled in the pores by physical and chemical vapor deposition using the AAO template, nanowires having the diameter and length identical to those of the pores can be manufactured.

The VLS method is the surest way to manufacture the nanowires of a single crystal structure in a large quantity, out of vapor phase methods. First, a starting material of a gas state is melted by a liquid droplet of a metal catalyst sized nm. This allows generation of nuclei and growth of single crystal rods. Then the single crystal rods are continually grown into nanowires.

In the VLS method, the growth of the nanowires is regulated by various methods. Each of the nanowires has a diameter determined according to size of catalyst particles. Thus, a smaller droplet of the catalyst ensures a thinner nanowire. Moreover, the nanowires may have a length regulated by a growth time.

Meanwhile, the MIS devices configured as the nanowire structures are arranged on the substrate 810. With a voltage applied, each of the nanowire structures emits light.

Filled portions 828 are defined between the nanowire structures 820 which are formed between the substrate 810 and the electrode 830, and may be an air. Alternatively, the filled portions 828 may be a transparent polymer resin which does not affect light emission of the nanowire structures 820.

The electrode 830 may be disposed on a top of the nanowire array to apply a voltage to the light emitting device.

Figure 12:
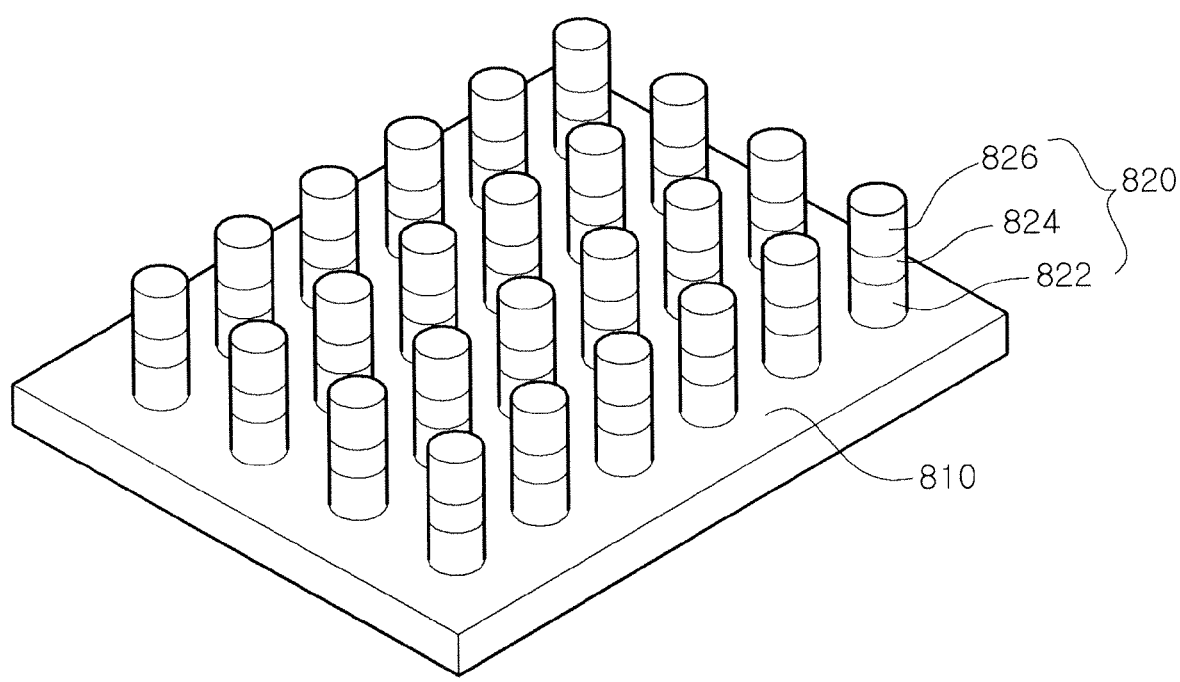
FIG. 12 is a view illustrating a three dimensional shape of the light emitting device shown in FIG. 11.

FIG. 12 is a view illustrating a three-dimensional shape of the light emitting device shown in FIG. 11. The nanowire structures 820 are arranged on the substrate 810. Each of the nanowire structures 820 includes the semiconductor layer 822, the insulating layer 824 and the metal layer 826. The Filled portions 828 and the electrode 830 are omitted.

The nanowire structure 820 is shaped as a wire and this nano-scale wire shape increases quantum confinement effect and broadens a light emitting surface, thereby increasing light emitting efficiency.

Figure 13:
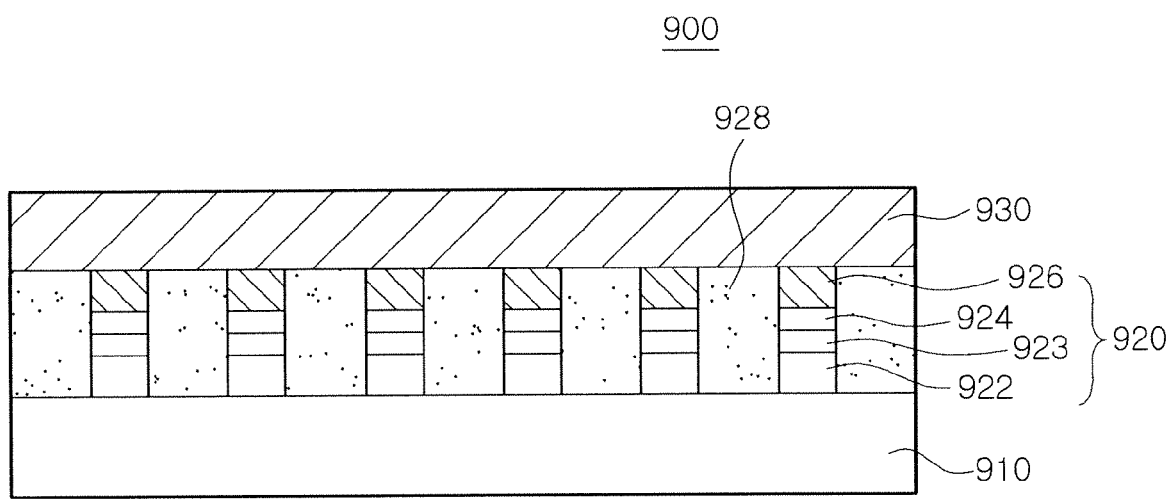
FIG. 13 is a cross-sectional view illustrating a light emitting device according to an exemplary embodiment of the invention.

FIG. 13 is a cross-sectional view illustrating a light emitting device according to an exemplary embodiment of the invention.

The light emitting device 900 includes a substrate 910, nanowire structures 920, and filled portions 928, and an electrode disposed on a top of a nanowire array including the nanowire array structures 920 to apply a voltage. The nanowire structures 920 of the nanowire array each may further include an active layer 923 between an insulating layer 924 and a semiconductor layer 922.

The active layer 923 allows active emission of light from the nano wire structures 920. To activate light emission, the active layer 923 may further include at least one of a quantum well structure and a quantum dot. The active layer 923 may be formed of any material capable of representing the quantum well structure. For example, the active layer 923 may be formed of a GaN-based semiconductor having a composition expressed by $In_xAl_yGa_{1-x-y}N$, where $0 \leq x \leq 1$, $0 \leq y \leq 1$, and $0 \leq x+y \leq 1$.

Figure 14:
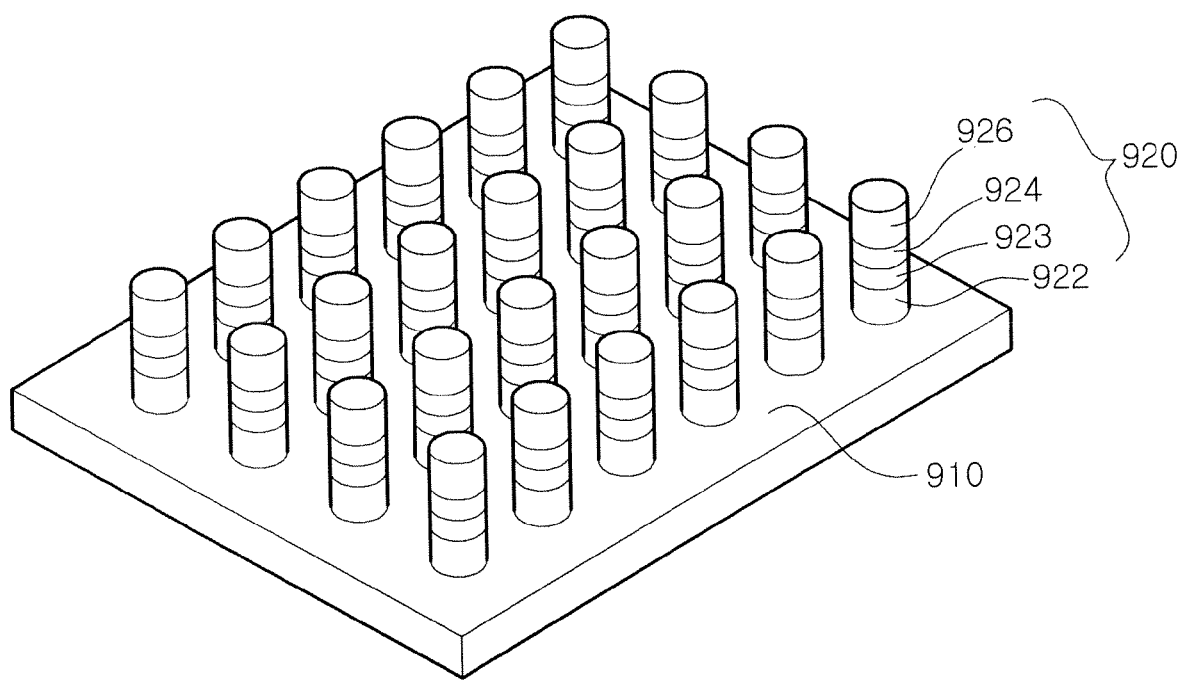
FIG. 14 is a view illustrating a three dimensional shape of the light emitting device shown in FIG. 13.

FIG. 14 is a view illustrating a three-dimensional shape of the light emitting device shown in FIG. 13. The nanowire structures 920 are arranged on the substrate 910 and each of the nanowire structures 920 includes the semiconductor layer 922, the active layer 923, the insulating layer 924 and the metal layer 926. The Filled portions 928 and the electrode 930 are omitted.

The light emitting device configured as a nanowire structure as described hereinabove, increases light emitting efficiency, and the active layer with a quantum well structure or quantum dot further enhances light emitting efficiency.

As set forth above, according to exemplary embodiments of the invention, the light emitting device is of a simpler structure than a conventional one, thus ensuring an economically efficient manufacturing process.

Also, the light emitting device does not need to have both a p-type semiconductor and an n-type semiconductor formed therein, but may be provided with only one of the two. This accordingly simplifies a process.

In addition, the light emitting device exhibits a broader light emitting area than a planar-type structure. Moreover, a quantum well structure, a quantum dot or a quantum line is provided in a semiconductor layer and an insulating layer to increase light emitting efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device comprising:
   a semiconductor layer;
   an active layer formed on the semiconductor layer, the active layer including a plurality of quantum dots, a plurality of quantum well structures, or a plurality of quantum lines;
   an insulating layer formed on the active layer; and
   a metal layer formed on the insulating layer,
   wherein the semiconductor layer, the insulating layer and the metal layer have microstructures disposed on surfaces thereof, respectively.

2. The light emitting device of claim 1, wherein the active layer comprises a plurality of quantum dots, and the plurality of quantum dots comprise a GaN-based compound.

3. The light emitting device of claim 1,
   wherein the active layer comprises a plurality of quantum lines, and the plurality of quantum lines comprise at least one of a group III-V compound semiconductor and a group II-VI compound semiconductor.

4. The light emitting device of claim 3, further comprising: an organic compound surrounding the plurality quantum lines.

5. A light emitting device comprising:
   a semiconductor layer;
   an active layer formed on the semiconductor layer, the active layer including a plurality of quantum dots, a plurality of quantum lines, or a plurality of quantum well structures;
   an insulating layer formed on the active layer; and
   a metal layer formed on the insulating layer, the metal layer having a plurality of holes formed in a surface thereof,
   wherein, if the active layer includes quantum dots, the quantum dots comprise at least one of a group III-V compound semiconductor and a group II-VI compound semiconductor,
   wherein the holes are extended to a portion between a top of the insulating layer and a top of the active layer.

6. The light emitting device of claim 5, further comprising a photonic crystal structure formed on one surface thereof.

7. A light emitting device comprising:
   a semiconductor layer;
   an active layer formed on the semiconductor layer, the active layer including a plurality of quantum dots, a plurality of quantum lines, or a plurality of quantum well structures;
   an insulating layer formed on the active layer; and
   a metal layer formed on the insulating layer, the metal layer having a plurality of holes formed in a surface thereof,
   wherein, if the quantum layer includes quantum dots, the quantum dots comprise at least one of a group III-V compound semiconductor and a group II-VI compound semiconductor,
   wherein the holes have a diameter and a spacing of 200 nm to 1000 nm, respectively.

8. A light emitting device comprising:
   a semiconductor layer;
   an active layer formed on the semiconductor layer, the active layer including a plurality of quantum dots or a plurality of quantum lines;
   an insulating layer formed on the active layer; and
   a metal layer formed on the insulating layer, further comprising a substrate, wherein a stack having the semiconductor layer, the active layer, the insulating layer and the metal layer sequentially stacked is formed on the substrate,
   wherein the stack is a nanowire structure,
   wherein, if the active layer includes quantum dots, the quantum dots comprise at least one of a group III-V compound semiconductor and a group II-VI compound semiconductor.

9. The light emitting device of claim 8, wherein the active layer includes the plurality of quantum dots, and quantum dots comprise a GaN-based compound.

* * * * *